④ United States Patent [19]

Hooker et al.

[11] 3,913,126

[45] Oct. 14, 1975

[54] SILICON DIOXIDE ETCH RATE CONTROL BY CONTROLLED ADDITIONS OF $P_2O_5$ AND $B_2O_3$

[75] Inventors: Colin Edwin Lambert Hooker; Derek William Tomes, both of Swindon, England

[73] Assignee: Plessey Handel und Investments A.G., Zug, Switzerland

[22] Filed: Aug. 9, 1973

[21] Appl. No.: 387,055

[30] Foreign Application Priority Data

Aug. 25, 1972 United Kingdom.............. 39669/72

[52] U.S. Cl. .................. 357/52; 148/174; 148/175; 148/176; 148/186; 148/1.5; 357/23; 357/54; 357/59

[51] Int. Cl.[2] .......................................... H01L 29/34

[58] Field of Search ........... 148/174, 175, 176, 186, 148/187, 189; 106/52; 317/235, DIG. 46.5; 156/17; 65/31; 357/34, 52, 54, 59

[56] References Cited

UNITED STATES PATENTS

| | | | |
|---|---|---|---|
| 2,480,672 | 8/1949 | Plank | 65/31 |
| 3,497,407 | 2/1970 | Esch et al. | 156/17 |
| 3,536,547 | 10/1970 | Schmidt | 156/17 |
| 3,759,761 | 9/1973 | Mori et al. | 148/186 |
| 3,784,424 | 1/1974 | Chang | 156/17 |
| 3,785,793 | 1/1974 | Park | 156/17 |

OTHER PUBLICATIONS

Horn, W. et al.; *Notes on the System $B_2O_3$–$SiO_2$–$P_2O_5$,* in *Journ. Soc. Glass Tech.,* 39, 1955, pp. 113–127.

*Primary Examiner*—Walter R. Satterfield
*Attorney, Agent, or Firm*—Blum, Moscovitz, Friedman & Kaplan

[57] ABSTRACT

A method of making an integrated circuit in which controlled chemical etching of silicon dioxide layers is achieved by the controlled addition of both phosphorus pentoxide and boron trioxide to the silicon dioxide layers. For a faster rate of etch, the percentage of phosphorus pentoxide is increased and for a slower rate of etch the percentage of boron trioxide is increased.

7 Claims, 11 Drawing Figures

SILICON DIOXIDE ETCH RATE CONTROL BY CONTROLLED ADDITIONS OF $P_2O_5$ AND $B_2O_3$

This invention relates to material for use in the production of semiconductor products, to a process for the production of the semiconductor products, and to the semiconductor products per se.

Semiconductor materials containing silicon are used in the manufacture of silicon semiconductor products such for example as integrated circuits, transistors, rectifiers, tunnel diodes, zener diodes and thyristors. The semiconductor products are manufactured in various ways and include layers of silicon and silicon dioxide.

Hitherto, silicon dioxide films on semi-conductor wafers have been formed by a thermal oxidation of the silicon, or by pyrolytic decomposition of silane gas, or by liquid spin-on techniques. When pyrolytic decomposition of silane is used, the silicon dioxide films are commonly deposited at temperatures of from 300° – 500°C and are then subjected to thermal densification at temperatures of from 750°–1100°C. It is often advantageous if, during the densification stage, the deposited silicon dioxide is melted and flowed to form a smoothly contoured surface. Unfortunately, silicon dioxide has a high melting point and is therefore not easy to melt.

We have found that the addition of phosphorus or boron dopants during the deposition stage is effective to reduce the melting point of the silicon dioxide. Usually, the phosphorus dopant will be phosphorus pentoxide and the boron dopant will be boron trioxide.

The manufacture of the semiconductor products may be such that various parts of the silicon dioxide films are removed by etching. The phosphorus and boron dopants seriously affect the etch rate of the deposited silicon dioxide in etchants commonly used in silicon slice processing. For example, a silicon dioxide glass containing approximately 35 percent by weight of phosphorus pentoxide for flowing at 1000°C. has an etch rate of approximately 15,000 A/min. compared to 1250 A/min. for a thermally grown silicon dioxide in the same etchant. Conversely, a silicon dioxide glass containing approximately 20 percent by weight of boron trioxide for flowing at 1000°C has an etch rate of only 200 A/min.

The changes in etch rate lead to great difficulties in fabricating semiconductor slices, especially at photo-engraving stages wherein contact windows often have to be etched through a composite layer of deposited and thermally grown silicon dioxide films. The differential etch rates lead to serious undercutting of the contact windows because, in the time that it takes for an etching solution to etch away the required area of one type of silicon dioxide film, e.g. thermally grown silicon dioxide film, the etching solution may have etched away too much of another type of silicon dioxide film, e.g. pyrolytically deposited silicon dioxide film.

By making use of the fact that silicon dioxide containing phosphorus etches faster than silicon dioxide containing boron, we have found that it is possible, by the selective use of both phosphorus and boron dopants together, to maintain a silicon dioxide etch rate which is comparable to that of another material, e.g. a thermally grown undoped silicon dioxide. For a faster etch rate, the percentage of phosphorus is increased and for a slower etch rate, the percentage of boron is increased.

It will thus be apparent that, by doping silicon dioxide with phosphorus and boron, we are able advantageously to lower the melting point of the silicon dioxide as well as being able to control its etch rate. For example, a deposited silicon dioxide containing 20 percent by weight of phosphorus pentoxide and 15 percent by weight of boron trioxide will flow at 1000°C and yet have an etch rate of approximately 1250 A/min.

Accordingly, the present invention provides silicon dioxide containing phosphorus and boron dopants.

The invention also provides a process for the production of a semiconductor product, which process includes the steps of pyrolytically depositing silicon dioxide containing phosphorus and boron dopants onto a semiconductor slice, and subsequently etching away silicon dioxide portions of the slice.

This invention also relates to the semiconductor products per se.

The process of the invention is advantageous in that the use of a phosphorus and boron dopant mixture:

(i) allows adjustments in the silicon dioxide etch rate in order to match that of underlying layers;

(ii) produces a deposited silicon dioxide film that may, if required, be allowed to melt to form a smooth surface;

(iii) produces a deposited silicon dioxide film whose melting point is compatible with other slice processing steps; and (iv) produces a silicon dioxide film that will melt in a more easily controlled manner without the formation of undesirable phases, such as happens with silicon dioxide films doped solely with phosphorus.

In a typical example of the process of the invention i.e. in the manufacture of silicon gate integrated circuits, the invention comprises thermally growing a silicon dioxide layer on top of a silicon slice, etching selected areas in the silicon dioxide layer down to the silicon slice, thermally growing a thin silicon dioxide layer over the exposed silicon, pyrolytically depositing polycrystalline silicon over the whole slice, etching away selected areas of the polycrystalline silicon and underlying thin silicon dioxide layer, introducing p- and/or n-type impurities in the silicon slice through the etched away areas, thermally growing a silicon dioxide layer on top of the polycrystalline silicon and on top of the doped silicon areas, pyrolytically depositing doped silicon dioxide containing phosphorus pentoxide and boron trioxide as dopants over the whole slice, heat flowing the material at for example 1,000°C, etching (for example by photo-engraving techniques) contact holes to give access to the impurity areas, optionally slightly re-flowing the pyrolytically deposited silicon dioxide, depositing aluminium, and finally etching away unwanted aluminium. Preferably, a silicon dioxide layer is deposited on top of the finished product to protect it.

The amount of phosphorus pentoxide and boron trioxide added can vary within fairly wide limits but care should be taken to avoid excess phosphorus pentoxide since excess phosphorus pentoxide may result in the production of an undesirable crystalline phase in the silicon dioxide. From 10 to 25 per cent boron trioxide may be employed together with from 10 to 30 per cent phosphorus pentoxide, the residue being silicon dioxide. In one preferred doped silicon dioxide material, the composition is 20 per cent by weight phosphorus pentoxide, 15 per cent by weight boron trioxide, and 65 per cent by weight silicon dioxide.

A typical silicon dioxide etching solution is 4 parts saturated ammonium fluoride solution and 1 part hydrofluoric acid. Other etching solutions may be used if desired.

The silicon dioxide films may be deposited on various semiconductor material substrates such for example as silicon, germanium and gallium arsenide.

An embodiment of the invention will now be described by way of example and with reference to the accompanying drawings, in which.

Figure 1:
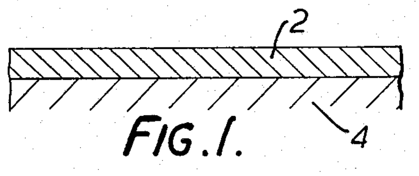
FIGS. 1 to 9 show various simplified stages in the production of an integrated circuit transistor.
Figure 2:
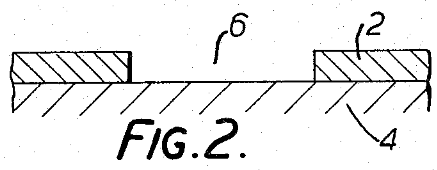
Figure 3:
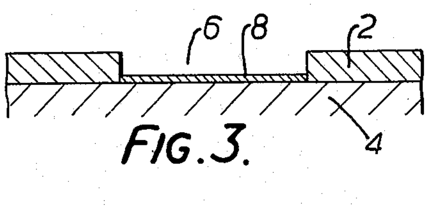
Figure 4:
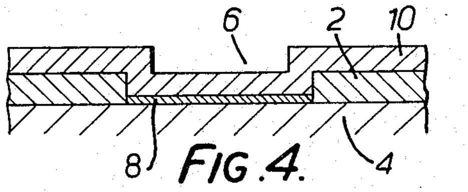
Figure 5:
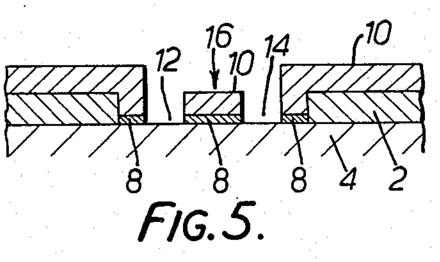
Figure 6:
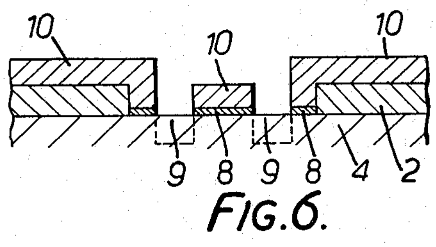
Figure 7:
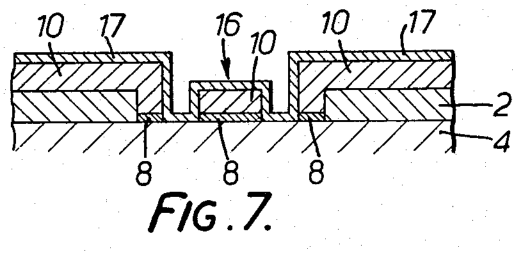
Figure 8:
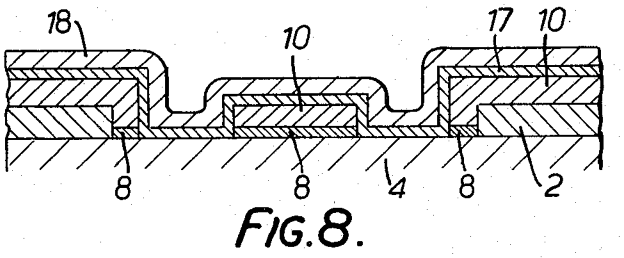

Referring to FIG. 1 to 9 and especially to FIG. 1, there is shown a silicon dioxide layer 2 which has been thermally grown on top of a silicon slice 4. A window or hole 6 (FIG. 2) is etched in the silicon dioxide layer 2 down to the silicon slice 4. A thin silicon dioxide layer 8 (FIG. 3) is then thermally grown over the silicon slice 4 at the bottom of the hole 6.

Polycrystalline silicon 10 (FIG. 4) is then pyrolytically deposited over the layers 2 and 8. It is then necessary to remove the polycrystalline silicon 10 in two areas 12, 14 (FIG. 5) to leave exposed areas for receiving p-type or n-type impurities. The removal of the said areas 12, 14 leaves a central island 16 composed of silicon dioxide and polycrystalline silicon. The island 16 forms a barrier preventing diffusion of the impurities in the area of the silicon slice 4 immediately beneath the island 16.

Deposition of the selected impurities is now made into the two exposed areas 9 of the silicon 4 and also into the poly-crystalline silicon layer 10. A silicon dioxide layer 17 is thermally grown over these doped areas either during the impurity deposition process itself or in a subsequent process.

A silicon dioxide layer 18 (FIG. 8) containing phosphorus pentoxide and boron trioxide dopants is then pyrolytically deposited for insulating purposes. This layer 18 is deposited from a vapour phase reaction at about 460°C. The phosphorus pentoxide and boron trioxide are produced from a reaction involving silane, phosphine, diborane and oxygen. The deposited silicon dioxide film containing the phosphorus and boron dopants is then subjected to thermal densification at about 1000°C. The silicon dioxide film flows during this thermal densification step to form a smooth surface.

Figure 9:
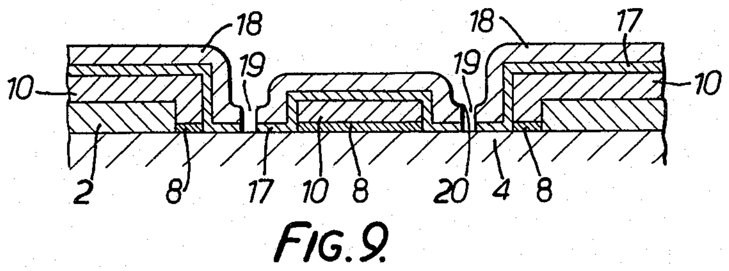
Figure 10:
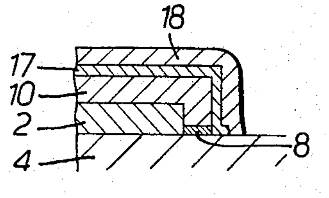
FIG. 10 shows an optical technique for preventing the formation of sharp corners prior to the deposition of aluminium.
Figure 11:
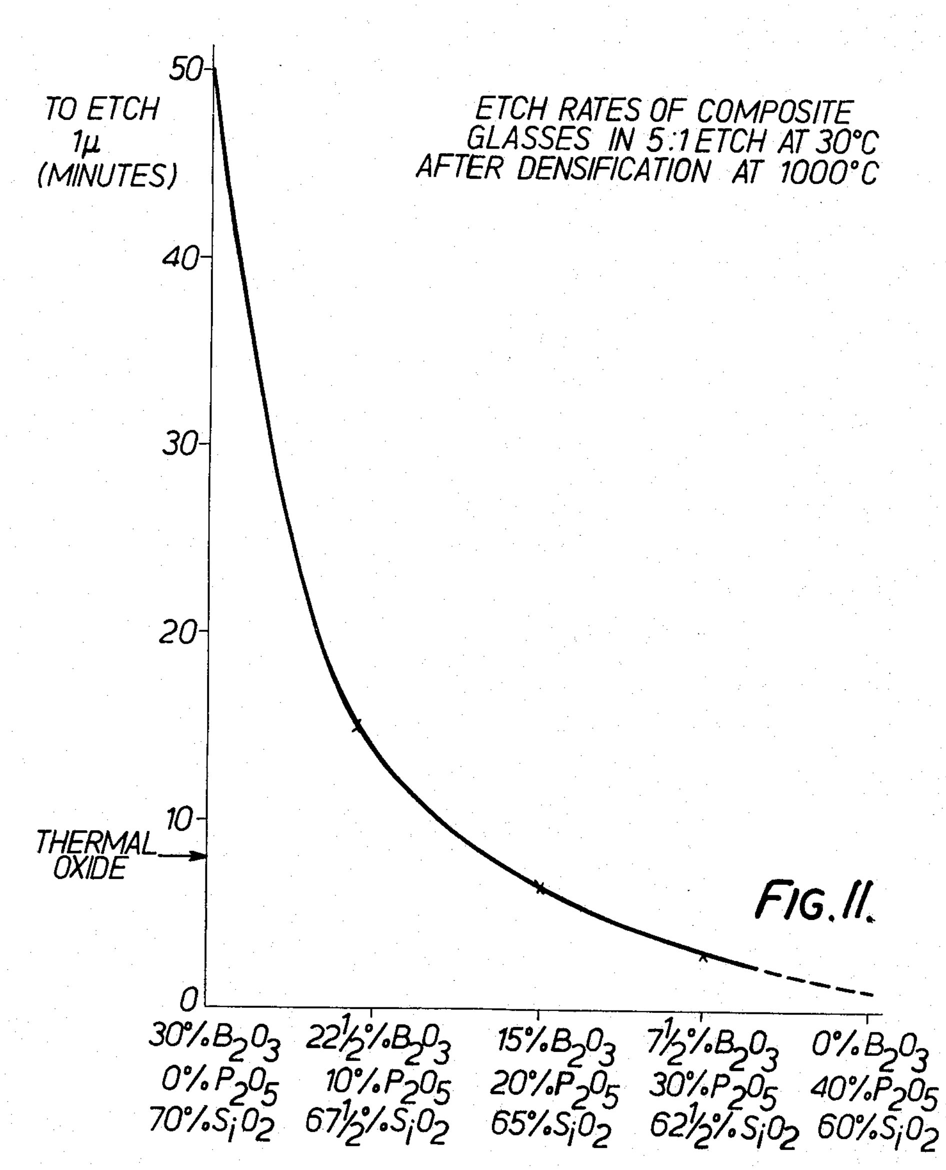
FIG. 11 is a graph indicating the percentages of phosphorus pentoxide and boron trioxide that may be employed.

Subsequently, windows or holes 19 are etched away as shown most clearly in FIG. 9. The holes 19 are etched away through layers 17 and 18 to expose diffused impurity areas which act as the source and drain. It will be noted from FIG. 9 that the holes are evenly etched due to the constant rate of etching allowed by the presence of the boron and phosphorus impurities. An optional slight re-flowing of the layer 18 may then occur to round off the sharp corners 20 as shown most clearly in FIG. 10. The reason for this is that the aluminium (not shown) which is next to be deposited does not easily adhere over sharp corners 20 and the said sharp corners may project through the aluminium. The aluminium may be deposited from boiling aluminium under a vacuum. Finally, unwanted aluminium is etched away to form the completed transistor.

We claim:

1. A process for the production of a transistor, which process includes the steps of pyrolytically depositing a silicon dioxide layer onto a semiconductor slice, and subsequently etching away silicon dioxide portions of the slice, said silicon dioxide layer consisting of from 10 to 25 per cent boron trioxide, from 10 to 30 per cent phosphorus pentoxide, the balance being silicon dioxide.

2. A process as claimed in claim 1 in which said silicon dioxide layer contains 20 per cent by weight phosphorus pentoxide, 15 per cent by weight boron trioxide and 65 per cent by weight silicon dioxide.

3. A process as claimed in claim 1 comprising thermally growing a silicon dioxide layer on top of a silicon slice, etching selected areas in the silicon dioxide layer down to the silicon slice, thermally growing a thin silicon dioxide layer over the exposed silicon, pyrolytically depositing polycrystalline silicon over the whole slice, etching away selected areas of the polycrystalline silicon and underlying thin silicon dioxide layer, introducing p- and/or n-type impurities in the silicon slice through the etched away areas, thermally growing a silicon dioxide layer on top of the polycrystalline silicon and on top of the doped silicon areas, pyrolytically depositing doped silicon dioxide containing phosphorus pentoxide and boron trioxide as dopants over the whole slice, raising the temperature of the slice and layers until said doped silicon layer flows sufficiently to become smooth, etching contact holes to give access to the impurity areas, depositing aluminium, and etching away unwanted aluminium.

4. A process as claimed in claim 3 including the step of raising the temperature of the pyrolytically-deposited silicon dioxide after the etching and before the deposition of the aluminium, the temperature to which said pyrolytically-deposited silicon dioxide is raised after said etching step being sufficient to cause said pyrolytically deposited layer to flow and round off corners thereof.

5. A process as claimed in claim 3 including depositing a protective layer of silicon dioxide over said slice subsequent to etching away unwanted aluminium.

6. A transistor comprising an insulating layer containing from 10 to 25 per cent boron trioxide together with from 10 to 30 per cent phosphorus pentoxide, the balance being silicon dioxide and the melting point of said layer being sufficiently low that said transistor can be brought without damage to the temperature at which said layer melts.

7. A transistor as claimed in claim 6 containing 20 per cent by weight phosphorus pentoxide, 15 per cent by weight boron trioxide and 65 per cent by weight silicon dioxide.

* * * * *